(12) United States Patent
Yu et al.

(10) Patent No.: US 11,729,499 B2
(45) Date of Patent: Aug. 15, 2023

(54) ELECTRONIC DEVICE AND METHOD FOR CONNECTING GROUND NODE TO CAMERA MODULE

(71) Applicant: SAMSUNG ELECTRONICS CO., LTD., Suwon-si (KR)

(72) Inventors: Changrim Yu, Suwon-si (KR); Yongwoog Shin, Suwon-si (KR); Yonghyun Park, Suwon-si (KR); Hyunseung Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 170 days.

(21) Appl. No.: 17/425,209

(22) PCT Filed: Jan. 22, 2020

(86) PCT No.: PCT/KR2020/001064
§ 371 (c)(1),
(2) Date: Jul. 22, 2021

(87) PCT Pub. No.: WO2020/153738
PCT Pub. Date: Jul. 30, 2020

(65) Prior Publication Data
US 2022/0086328 A1 Mar. 17, 2022

(30) Foreign Application Priority Data
Jan. 24, 2019 (KR) .................. 10-2019-0009307

(51) Int. Cl.
*H04N 23/661* (2023.01)
*H04N 23/57* (2023.01)
*H04N 23/65* (2023.01)

(52) U.S. Cl.
CPC ........... *H04N 23/661* (2023.01); *H04N 23/57* (2023.01); *H04N 23/65* (2023.01)

(58) Field of Classification Search
CPC .. H01L 27/14609; H01Q 1/24; H04B 17/318; H04M 1/02; H04N 23/57; H04N 23/65;
(Continued)

(56) References Cited

U.S. PATENT DOCUMENTS 8,854,276 B2 * 10/2014 Koyama ............... H01Q 1/24
343/876
2007/0029467 A1 2/2007 Lee
(Continued)

FOREIGN PATENT DOCUMENTS

JP 2011-62069 3/2011
KR 10-2003-0036484 5/2003
(Continued)

OTHER PUBLICATIONS

International Search Report for PCT/KR2020/001064, dated May 14, 2020, 4 pages.
(Continued)

*Primary Examiner* — Amy R Hsu
(74) *Attorney, Agent, or Firm* — Nixon & Vanderhye, P.C.

(57) ABSTRACT

An electronic device according to various embodiments comprises: an antenna; a camera module; at least one capacitor; a switching circuit; and a controller operatively coupled to the antenna, the camera module, the at least one capacitor, and the switching circuit, wherein the controller, in a state where the at least one capacitor that is connected in parallel to a power supply node inputted to the camera module is connected to a first node by the switching circuit, identifies a wireless signal related to the antenna, and in response to an identification of the wireless signal, controls the switching circuit to thereby connect the at least one capacitor from the first node to a second node distinguished from the first node.

14 Claims, 8 Drawing Sheets

(58) Field of Classification Search
CPC ............. H04N 23/661; H04N 23/6812; H04N 23/687; H05K 9/00
See application file for complete search history.

(56) References Cited

U.S. PATENT DOCUMENTS

| | | | |
|---|---|---|---|
| 2008/0070637 A1* | 3/2008 | Park | H04B 1/3838 |
| | | | 455/566 |
| 2011/0136475 A1 | 6/2011 | Jung | |
| 2016/0112070 A1 | 4/2016 | Ryu | |
| 2021/0028870 A1* | 1/2021 | Balteanu | H04B 17/318 |
| 2021/0194608 A1* | 6/2021 | Yao | H04B 1/1036 |
| 2022/0051641 A1* | 2/2022 | Park | G09G 5/10 |

FOREIGN PATENT DOCUMENTS

| | | |
|---|---|---|
| KR | 10-2006-0112852 | 11/2006 |
| KR | 10-0719370 | 5/2007 |
| KR | 10-2007-0078208 | 7/2007 |
| KR | 10-2008-0024849 | 3/2008 |
| KR | 10-2011-0064659 | 6/2011 |
| KR | 10-2016-0044908 | 4/2016 |

OTHER PUBLICATIONS

Written Opinion of the ISA for PCT/KR2020/001064, dated May 14, 2020, 5 pages.
Office Action dated Mar. 21, 2023 in KR Application No. KR10-2019-0009307 and English-language translation.

\* cited by examiner

ELECTRONIC DEVICE AND METHOD FOR CONNECTING GROUND NODE TO CAMERA MODULE

This application is the U.S. national phase of International Application No. PCT/KR2020/001064 filed 22 Jan. 2020, which designated the U.S. and claims priority to KR Patent Application No. 10-2019-0009307 filed 24 Jan. 2019, the entire contents of each of which are hereby incorporated by reference.

TECHNICAL FIELD

Various embodiments, which will be described below, relate to an electronic device for connecting a ground node to a camera module and a method thereof.

BACKGROUND ART

Electronic devices enabling users to enjoy various contents while carrying them, such as mobile phones, tablets, and notebooks, or the like, are increasingly used. Various kinds of additional devices may be mounted in such electronic devices in order to enable users to enjoy various contents. A camera module for making a photo or a video of a subject is a representative additional device. An electronic device including a camera module may capture a necessary image or material when it is in use. In addition, with the development of Internet of things (IoT) and communication, services for transmitting an image captured by the camera module in real time are provided.

DISCLOSURE OF INVENTION

Technical Problem

When a camera module and an antenna module are used in an electronic device simultaneously, radiation performance of the antenna module may be degraded due to the operating camera module.

The technical objects to be achieved by the disclosure are not limited to that mentioned above, and other technical objects that are not mentioned above may be clearly understood to those skilled in the art based on the description provided below.

Solution to Problem

An electronic device according to various embodiments may include: an antenna; a camera module; at least one capacitor; a switching circuit; and a controller which is operatively coupled to the antenna, the camera module, the at least one capacitor, and the switching circuit, and the controller may identify a wireless signal related to the antenna in a state where the at least one capacitor connected with a power supply node inputted to the camera module in parallel is connected to a first node by the switching circuit, and, in response to the identification of the wireless signal, to control the switching circuit to connect the at least one capacitor to a second node distinguished from the first node from the first node.

According to various embodiments, there is provided an electronic device including at least one port for supplying a power to a camera module of the electronic device, at least one capacitor connected with the at least one port, and a switching circuit connected with the at least one capacitor, wherein the switching circuit switches the at least one capacitor between a first node and a second node, based on a control signal inputted to the switching circuit, and the first node and the second node are nodes which ground a first circuit element included in the camera module to process an analogue signal, and a second circuit element included in the camera module to process a digital signal, respectively.

According to various embodiments, there is provided a method of an electronic device, the method including: identifying a state of a camera module of the electronic device; in response to an identification of the state of the camera module capturing at least one image, identifying a state of an antenna of the electronic device; and, in response to an identification of the state of the antenna which transmits or receive a wireless signal, connecting at least one capacitor connected to a power supply node related to the camera module to a ground node for grounding a circuit element which is included in the camera module to process a digital signal.

Advantageous Effects of Invention

The electronic device and the method thereof according to various embodiments can prevent radiation performance of the antenna module from being degraded by the operating camera module when the camera module and the antenna module are used simultaneously.

The effect achieved by the disclosure is not limited to those mentioned above, and other effects that are not mentioned above may be clearly understood to those skilled in the art based on the description provided below.

BEST MODE FOR CARRYING OUT THE INVENTION

Figure 1:
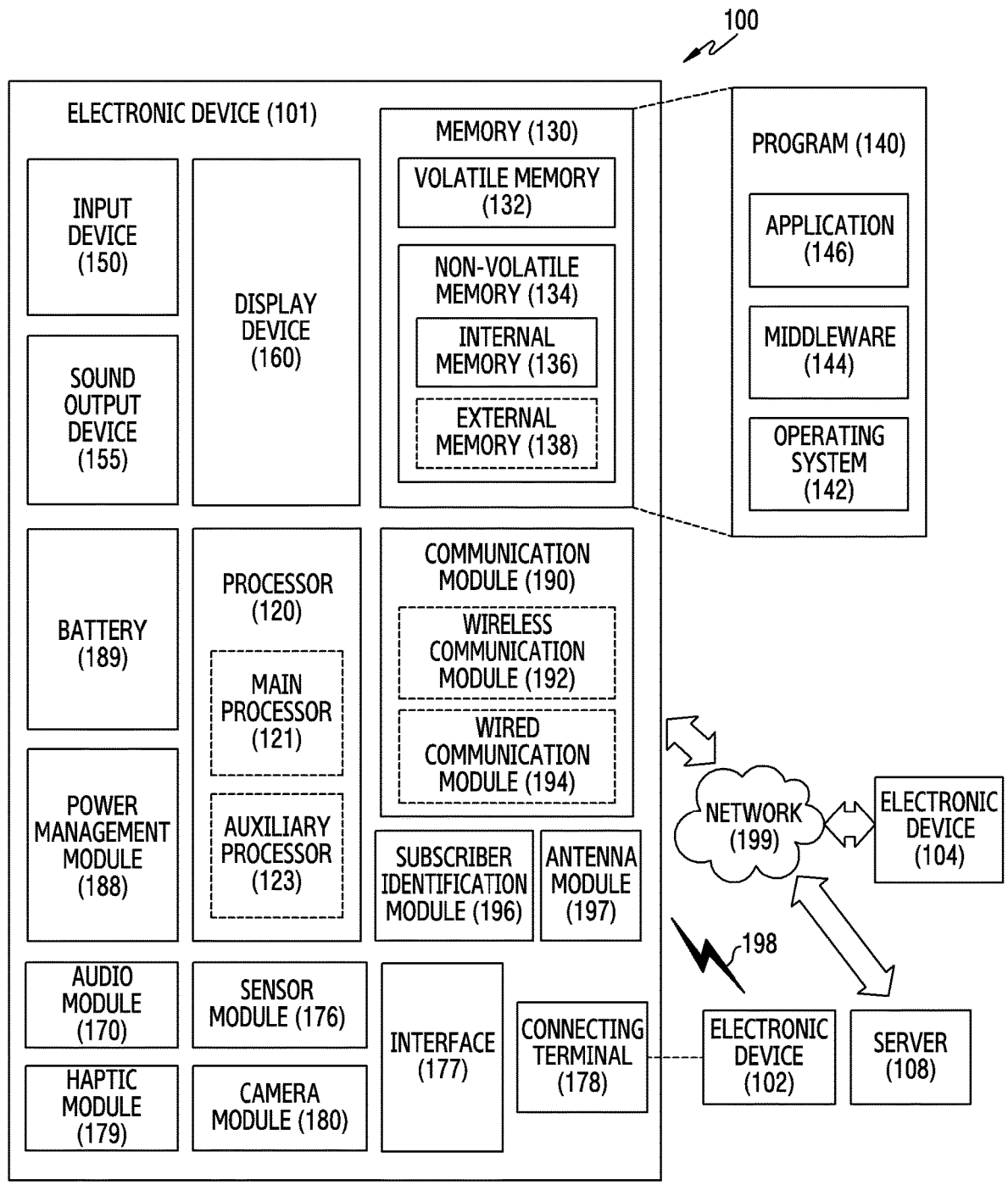
FIG. 1 is a block diagram of an electronic device in a network environment according to various embodiments.

Hereinafter, various embodiments will be described in detail with reference to the accompanying drawings. For convenience of explanation, sizes of elements in the drawings may be exaggerated or reduced. For example, sizes and thicknesses of respective elements shown in the drawings are arbitrarily illustrated for convenience of explanation, and the present disclosure is not limited to those illustrated in the drawings.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
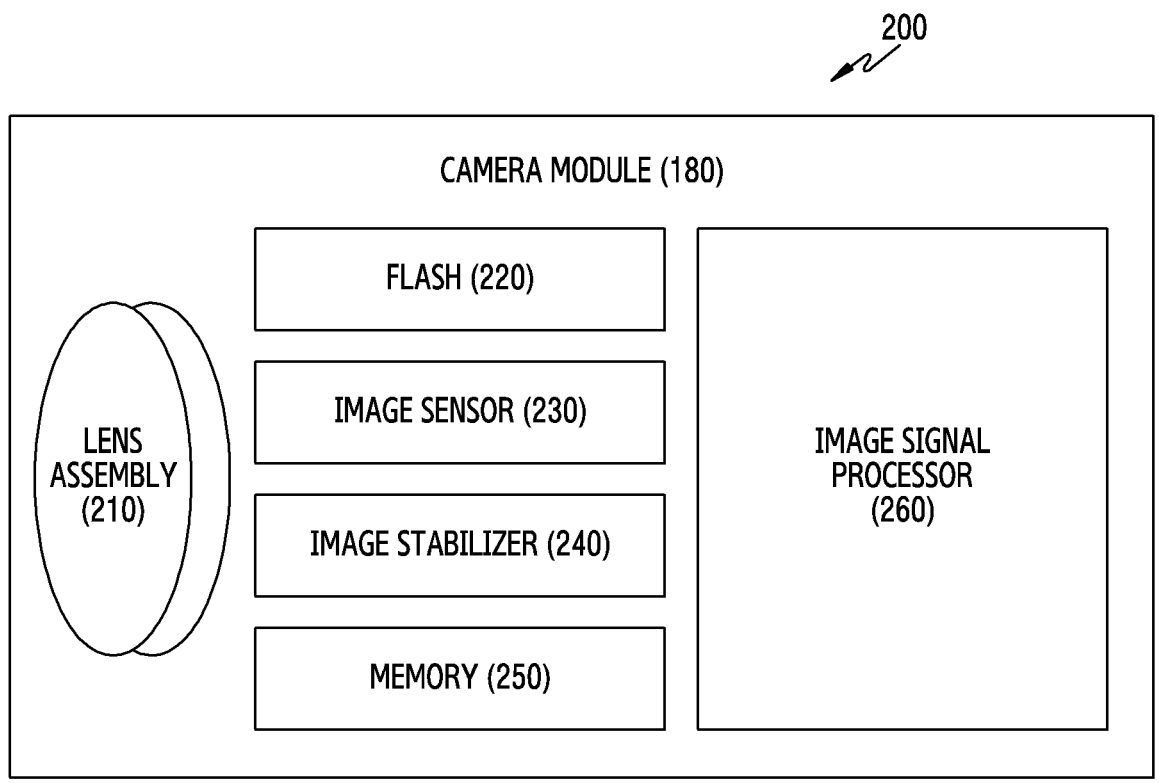
FIG. 2 is a block diagram illustrating a camera module according to various embodiments.

FIG. 2 is a block diagram 200 illustrating the camera module 180 according to various embodiments. Referring to FIG. 2, the camera module 180 may include a lens assembly 210, a flash 220, an image sensor 230, an image stabilizer 240, memory 250 (e.g., buffer memory), or an image signal processor 260. The lens assembly 210 may collect light emitted or reflected from an object whose image is to be taken. The lens assembly 210 may include one or more lenses. According to an embodiment, the camera module 180 may include a plurality of lens assemblies 210. In such a case, the camera module 180 may form, for example, a dual camera, a 360-degree camera, or a spherical camera. Some of the plurality of lens assemblies 210 may have the same lens attribute (e.g., view angle, focal length, auto-focusing, f number, or optical zoom), or at least one lens assembly may have one or more lens attributes different from those of another lens assembly. The lens assembly 210 may include, for example, a wide-angle lens or a telephoto lens.

The flash 220 may emit light that is used to reinforce light reflected from an object. According to an embodiment, the flash 220 may include one or more light emitting diodes (LEDs) (e.g., a red-green-blue (RGB) LED, a white LED, an infrared (IR) LED, or an ultraviolet (UV) LED) or a xenon lamp. The image sensor 230 may obtain an image corresponding to an object by converting light emitted or reflected from the object and transmitted via the lens assembly 210 into an electrical signal. According to an embodiment, the image sensor 230 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 230 may be implemented using, for example, a charged coupled device (CCD) sensor or a complementary metal oxide semiconductor (CMOS) sensor.

The image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least part of a negative effect (e.g., image blurring) by the movement on an image being captured. According to an embodiment, the image stabilizer 240 may sense such a movement by the camera module 180 or the electronic device 101 using a gyro sensor (not shown) or an acceleration sensor (not shown) disposed inside or outside the camera module 180. According to an embodiment, the image stabilizer 240 may be implemented, for example, as an optical image stabilizer. The memory 250 may store, at least temporarily, at least part of an image obtained via the image sensor 230 for a subsequent image processing task. For example, if image capturing is delayed due to shutter lag or multiple images are quickly captured, a raw image obtained (e.g., a Bayer-patterned image, a high-resolution image) may be stored in the memory 250, and its corresponding copy image (e.g., a low-resolution image) may be previewed via the display device 160. Thereafter, if a specified condition is met (e.g., by a user's input or system command), at least part of the raw image stored in the memory 250 may be obtained and processed, for example, by the image signal processor 260. According to an embodiment, the memory 250 may be configured as at least part of the memory 130 or as a separate memory that is operated independently from the memory 130.

The image signal processor 260 may perform one or more image processing with respect to an image obtained via the image sensor 230 or an image stored in the memory 250. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 260 may perform control (e.g., exposure time control or read-out timing control) with respect to at least one (e.g., the image sensor 230) of the components included in the camera module 180. An image processed by the image signal processor 260 may be stored back in the memory 250 for further processing, or may be provided to an external component (e.g., the memory 130, the display device 160, the electronic device 102, the electronic device 104, or the server 108) outside the camera module 180. According to an embodiment, the image signal processor 260 may be configured as at least part of the processor 120, or as a separate processor that is operated independently from the processor 120. If the image signal processor 260 is configured as a separate processor from the processor 120, at least one image processed by the image signal processor 260 may be displayed, by the processor 120, via the display device 160 as it is or after being further processed.

According to an embodiment, the electronic device 101 may include a plurality of camera modules 180 having different attributes or functions. In such a case, at least one of the plurality of camera modules 180 may form, for example, a wide-angle camera and at least another of the plurality of camera modules 180 may form a telephoto camera. Similarly, at least one of the plurality of camera modules 180 may form, for example, a front camera and at least another of the plurality of camera modules 180 may form a rear camera.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3:
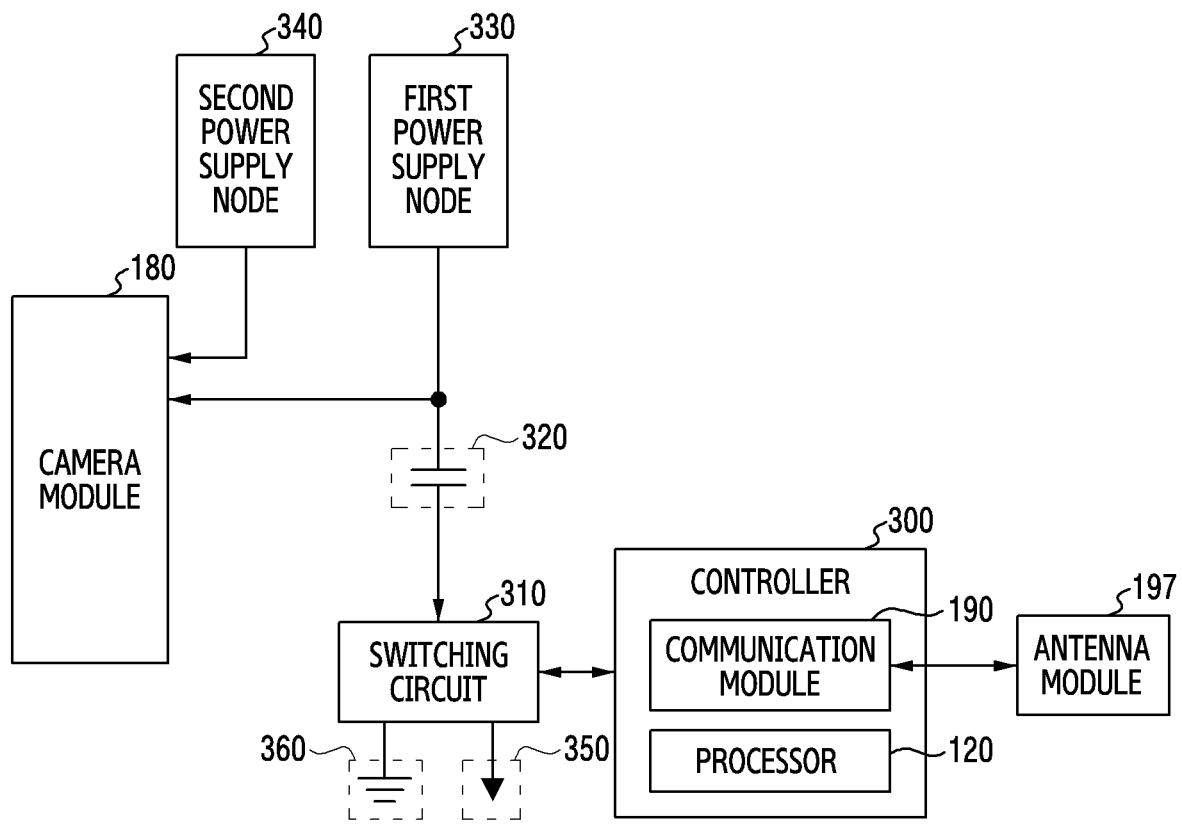
FIG. 3 is a block diagram of an electronic device according to various embodiments.

FIG. 3 is a block diagram of an electronic device 101 according to various embodiments. The electronic device 101 may correspond to at least one of a smartphone, a smart pad, a tablet personal computer (PC), a personal digital assistance (PDA), a laptop PC, or a desktop PC. The electronic device 101 may correspond to a wearable device including at least one of an accessory (for example, watches, rings, bracelets, ankle bracelets, necklaces, glasses, contact lenses, head-mounted-devices (HMDs)), a fabric- or clothing-mounted device (for example, electronic apparels), a body-mounted device (for example, skin pads or tattoos), a bio-implantable circuit, or the like. The electronic device 101 may be a home appliance such as a refrigerator, a television (TV), a cleaner, an air conditioner, a washing machine, and an illumination device.

Referring to FIG. 3, the electronic device 101 may include a controller 300, an antenna module 197, a switching circuit 310, and a camera module 180. The controller 300 may include a communication module 190 and/or a processor 120. The processor 120, the camera module 180, the communication module 190, the antenna module 197 may correspond to the processor 120, the camera module 180, the communication module 190, the antenna module 197 of FIGS. 1 and 2, respectively. For example, the controller 300, the antenna module 197, the switching circuit 310, and the camera module 180 may be electrically and/or operatively connected with one another, based on a communication bus.

The hardware components of the electronic device 101 described above may be disposed on a printed circuit board (PCB) of the electronic device 101. The above-described hardware components may be connected with one another based on circuit elements and/or nodes disposed on the PCB. Referring to FIG. 3, the electronic device 101 may include a first power supply node 330 and a second power supply node 340 to supply a power to the camera module 180. The electronic device 101 may include a first capacitor 320 to connect the first power supply node 330, the camera module 180, and the switching circuit 310. The first power supply node 330 and the second power supply node 340 shown in FIG. 3 may not limit the number of power supply nodes for supplying a power to the camera module 180, and the number of power supply nodes may vary according to an embodiment. The first capacitor 320 shown in FIG. 3 may not limit the number of capacitors for connecting at least one power supply node, the camera module 180, and the switching circuit 310, and the number of capacitors included in the first capacitor 320 may vary according to an embodiment.

The camera module 180 may generate data which is based on light passing through a lens assembly (for example, the lens assembly 210 of FIG. 2) seen from the outside through one surface of a housing of the electronic device 101. The camera module 180 may include, for example, all of a circuit element which is based on an analogue signal like the image sensor 230 of FIG. 2, and a circuit element which is based on a digital signal like the image signal processor 260 of FIG. 2. When the plurality of circuit elements included in the camera module 180 require powers based on different voltages, the camera module 180 may acquire powers having voltages of different levels corresponding to the plurality of circuit elements, respectively, through different ports.

In an embodiment, the first power supply node 330 may supply a power to at least one circuit element which is included in the camera module 180 to process an analogue signal. The power may be based on an analogue power supply of the electronic device 101. The circuit element of the camera module 180 for processing an analogue signal may include, for example, the image sensor 230 of FIG. 2. In an embodiment, the second power supply node 340 may supply a power to at least one circuit element which is included in the camera module 180 to process a digital signal. The power may be based on a digital power supply of the electronic device 101. The circuit element of the camera module 180 for processing a digital signal may include, for example, the image signal processor 260 of FIG. 2.

The first power supply node 330 and/or the second power supply node 340 may output a direct current electric signal having a voltage of a designated level. The direct current electric signal may include a frequency component which is based on a noise. The first capacitor 320 may be disposed between the first power supply node 330 and the camera module 180 to reduce a noise included in the direct current electric signal which is based on the analogue power supply outputted from the first power supply node 330. The first capacitor 320 may be disposed between the first power supply node 330 and the switching circuit 310. The first capacitor 320 and the switching circuit 310 may be connected with each other in series. The first capacitor 320 may be connected with the first power supply node 330 and the camera module 180 in parallel.

Referring to FIG. 3, the switching circuit 310 may connect the first capacitor 320, which is connected with the first power supply node 330, to at least one of a first ground node 350 and a second ground node 360. The first ground node 350 may be a ground node that is connected with at least one circuit element for processing an analogue signal within the camera module 180. The second ground node 360 may be a ground node that is connected with at least one circuit element for processing a digital signal within the camera module 180. To reduce an influence of a high frequency component included in the digital signal on the analogue signal, the circuit element of the camera module 180 for processing the digital signal may be connected with the second ground node 360, which is distinguished from the first ground node 350 to which another circuit element of the camera module 180 for processing the analogue signal is connected. The first ground node 350 and/or the second ground node 360 may be distinguished from a ground node (for example, a main ground node) to which other circuit elements distinguished from the camera module 180 in the electronic device 101 are connected.

The switching circuit 310 may connect the first capacitor 320, which is connected with the first power supply node 330 corresponding to the circuit element of the camera module 180 for processing the analogue signal, to at least one of the first ground node 350 and the second ground node 360. The switching circuit 310 connecting the first capacitor 320 to at least one of the first ground node 350 and the second ground node 360 may be related to whether an operation of the camera module 180 influences signal processing of other hardware components (for example, the antenna module 197 and/or the communication module 190).

In an embodiment, the controller 300 may control the switching circuit 310, based on at least a part of influence of the operation of the camera module 180 on operations of other hardware components of the electronic device 101, to connect the first capacitor 320 to at least one of the first ground node 350 and the second ground node 360. The controller 300 may connect the first capacitor 320 to at least one of the first ground node 350 and the second ground node 360, based on a control signal transmitted to the switching circuit 310.

The controller 300 may include the processor 120. The processor 120 may correspond to an application processor (AP) of the electronic device 101. The processor 120 may execute one or more instructions stored in a memory (for example, the memory 130 of FIG. 1). The processor 120 may include a circuit for processing data, for example, at least one of an integrated circuit (IC), an arithmetic logic unit (ALU), a field programmable gate array (FPGA), large scale integration (LSI).

The controller 300 may include the communication module 190. The communication module 190 may connect the electronic device 101 to an external device and/or a network, based on a wireless network such as Bluetooth, Wireless Fidelity (WiFi), near field communication (NFC), long term evolution (LTE), and a wired network such as a local area network (LAN), ethernet. The communication module 190 may include at least one of a communication modem, a communication circuit, a communication processor (CP), and a communication interface for supporting a wireless network or a wired network.

The electronic device 101 may include the antenna module 197 connected with the communication module 190 of the controller 300. The number of antenna modules 197 included in the electronic device 101 is not limited to the number of antenna modules 197 shown in FIG. 3, and the number of antenna modules 197 may vary according to an embodiment. The antenna module 197 may transmit or receive a wireless signal including at least one of a GPS signal, a Bluetooth signal, a WiFi signal, an LTE signal, a data signal, and/or a voice signal. The communication module 190 may receive a wireless signal based on the antenna module 197, and may acquire data corresponding to the wireless signal by processing the received wireless signal. The acquired data may be processed by the processor 120 and an application ongoing in the processor 120. When the processor 120 transmits data generated based on the ongoing application to the communication module 190, the communication module 190 may output a wireless signal corresponding to the data by using the antenna module 197.

When a wireless signal is transmitted or received based on the antenna module 197 with the camera module 180 being operated, the camera module 180 may influence radiation performance of the antenna module 197. For example, when a GPS signal is received or an access to WiFi is performed in a state where a user of the electronic device 101 uses a video call service or an application (for example, a camera application) related to the camera module 180 is operated, the camera module 180 may influence a receiver sensitivity of the wireless signal transmitted or received through the antenna module 197. The receiver sensitivity is a minimum strength of a communication signal by which the electronic device 101 can receive a communication signal at an error rate (for example, a bit error rate (BER), a block error rate (BLER) less than or equal to a threshold value. An error rate of a received signal may increase due to a noise and an interference signal which are generated by the camera module 180, and as a result, receiver sensitivity performance may be degraded. For example, if the receiver sensitivity is −100 dBm when the camera module 180 is not operated, the receiver sensitivity may be degraded to −95 dBm when the camera module 180 is operated. An example of arrangements of the antenna module 197 and the camera module 180 in the electronic device 101, and a change in radiation performance according to arrangements of the antenna module 197 and the camera module 180 will be described in detail with reference to FIG. 5.

According to various embodiments, the electronic device 101 and/or the controller 300 may connect a circuit element (for example, the first capacitor 320) related to the camera module 180 to at least one of the first ground node 350 and the second ground node 360, based on an operation state of the antenna module 197 and/or the communication module 190. Based on switching of the ground node related to the camera module 180, the electronic device 101 and/or the controller 300 may enhance radiation performance of the antenna module 197. Hereinafter, an operation of controlling, by the electronic device 101 and/or the controller 300, the switching circuit 310 to connect a circuit element (for example, the first capacitor 320) related to the camera module 180 to at least one of the first ground node 350 and the second ground node 360 will be described with reference to FIG. 4.

Figure 4:
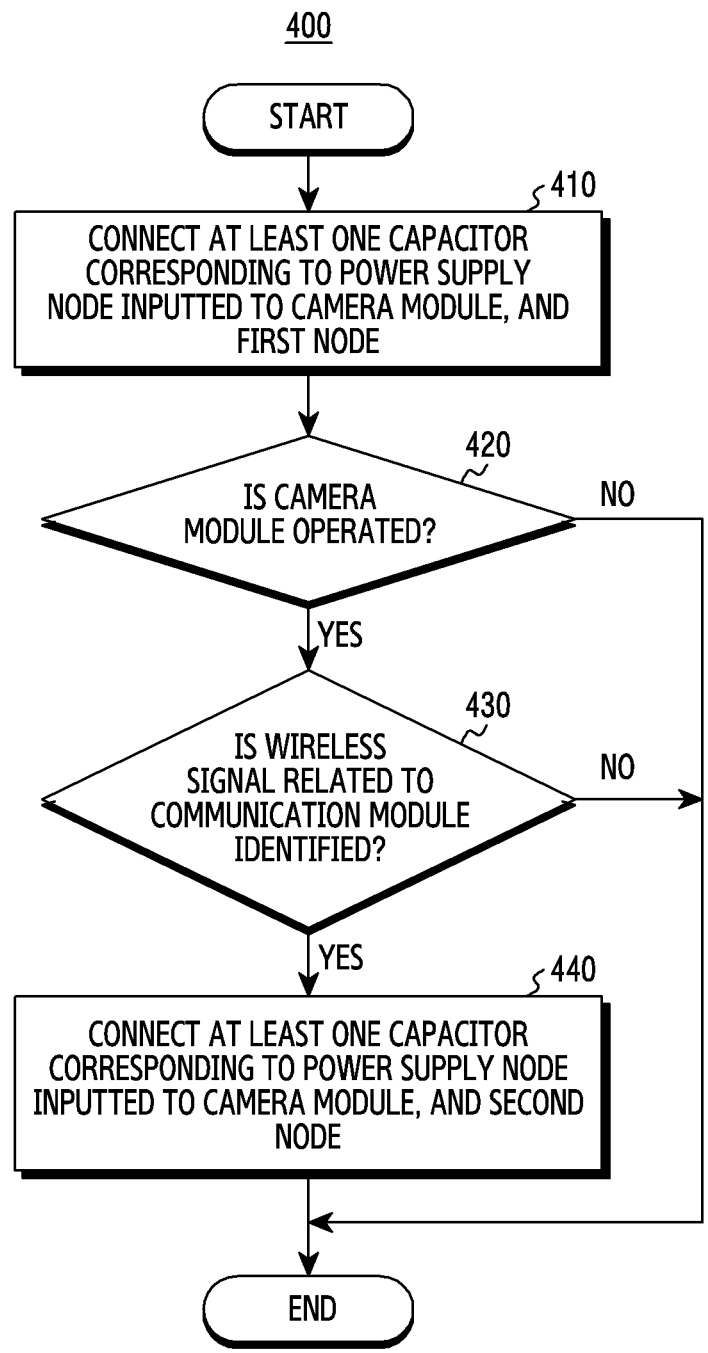
FIG. 4 is a flowchart to explain an operation of an electronic device according to various embodiments.

FIG. 4 is a flowchart 400 to explain an operation of an electronic device according to various embodiments. The electronic device of FIG. 4 may correspond to the electronic device 101 of FIGS. 1 to 3. Operations of FIG. 4 may be performed by the electronic device 101 of FIGS. 1 to 3 and/or the controller 300 of FIG. 3. The electronic device according to various embodiments may select a ground node related to a power supply node of a camera module, from any one of a digital ground node (for example, the second ground node 360 of FIG. 3) and an analogue ground node (for example, the first ground node 350 of FIG. 3), based on an operation state of the camera module and/or an operation state of an antenna module.

Referring to FIG. 4, in operation 410, the electronic device according to various embodiments may connect at least one capacitor which corresponds to a power supply node inputted to the camera module, and a first node. The camera module may correspond to the camera module 180 of FIG. 3. The power supply node is a power supply node which is based on an analogue power supply inputted to the camera module, and for example, may correspond to the first power supply node 330 of FIG. 3. The at least one capacitor corresponding to the power supply node may be connected with the camera module and the power supply node in parallel in order to reduce a noise included in a direct current electric signal acquired from the power supply node. The at least one capacitor may include, for example, the first capacitor 320 of FIG. 3.

The first node, which is an analogue ground node, may correspond to a ground node related to the at least one capacitor. For example, the first node may include the first ground node 350 of FIG. 3. Circuit elements included in the camera module to process an analogue signal may be connected to the first node corresponding to the analogue ground node.

Operation 410 of connecting the at least one capacitor and the first node may be performed by, for example, the switching circuit 310 of FIG. 3. Referring to FIG. 3, the controller 300 may transmit a control signal which is based on operation 410 of FIG. 4 to the switching circuit 310, and the switching circuit 310 may connect the first capacitor 320 and the first ground node 350, based on the control signal.

In the state where the at least one capacitor related to the camera module and the first node are connected with each other, the electronic device according to various embodiments may determine whether the camera module is operated in operation 420. For example, the camera module may be operated according to a user input for making at least one image and/or video. The operation of the camera module may include, for example, a state in which data (for example, image data and/or frame data) based on the image sensor 230 of FIG. 2 is outputted from the camera module. In an embodiment, the electronic device may identify a state of the camera module based on operation 420.

The order of operations 410, 420 is not limited by the order shown in FIG. 4, and the order of operations 410, 420 may vary according to an embodiment, or the operations may be performed simultaneously. In an embodiment, the electronic device may identify a state of the camera module. When a user of the electronic device executes an application related to the camera module (for example, a camera application and/or a video call application), the electronic device may identify that the camera module is operated.

Referring to FIG. 3, operation 420 may be performed by the communication module 190 and/or the processor 120 included in the controller 300. For example, when a user input for executing the application related to the camera module is identified from the user, the processor 120 may inform the communication module 190 of execution of the camera module while controlling the camera module based on the user input. When the camera module is not operated, the processor 120 may maintain the connection state between the at least one capacitor connected to the power supply node of the camera module in parallel, and the first node, based on operation 410.

Referring to FIG. 4, when the camera module is operated, the electronic device according to various embodiments may identify a wireless signal related to the communication module 190 in operation 430. An antenna connected to the communication module 190 may correspond to an antenna disposed adjacent to the camera module from among antennas included in the antenna module 197 of FIG. 3. The wireless signal may include a wireless signal which is transmitted from or received to the outside through the antenna. Referring to operations 420, 430, the electronic device according to an embodiment may identify a state of the communication module 190 of the electronic device in response to identification of a state of the camera module capturing at least one image. The state of the communication module 190 may include a first state in which a wireless signal is transmitted or received, and a second state which includes an idle state and is distinguished from the first state. In response to identification of the state of the communication module 190 corresponding to the idle state or the second state, the electronic device may maintain the connection state between the at least one capacitor connected to the power supply node of the camera module in parallel, and the first node, based on operation 410.

Referring to FIG. 3, operation 430 may be performed by the communication module 190 and/or the processor 120 included in the controller 300. For example, when the wireless signal related to the communication module 190 is identified, the communication module 190 may inform the processor 120 of identification of the wireless signal. When the processor 120 informs the communication module 190 of execution of the camera module based on operation 420, the communication module 190 may identify the wireless signal based on operation 430.

Referring to FIG. 4, when the wireless signal related to the communication module is identified, the electronic device according to various embodiments may connect the least one capacitor corresponding to the power supply node inputted to the camera module, and a second node in operation 440. In an embodiment, in the state in which the at least one capacitor and the second node are connected with each other, the at least one capacitor and the first node may be disconnected. The second node, which is a digital ground node, may correspond to a ground node which is distinguished from the first node and is related to the at least one capacitor. For example, the second node may include the second ground node 360 of FIG. 3. Circuit elements included in the camera module to process a digital signal may be connected to the second node corresponding to the digital ground node.

In an embodiment, when the wireless signal is identified with the camera module being operated, the electronic device may perform operation 440 based on a noise included in the wireless signal. The operation performed by the electronic device based on the noise included in the wireless signal will be described in detail with reference to FIG. 7.

Operation 440 of connecting the at least one capacitor and the second node may be performed by, for example, the switching circuit 310 of FIG. 3. Referring to FIG. 3, the controller 300 may transmit a control signal which is based on operation 440 of FIG. 4 to the switching circuit 310, and the switching circuit 310 may connect the first capacitor 320 and the second ground node 360 based on the control signal. The switching circuit 310 may restrict connection between the first capacitor 320 and the first ground node 350 in response to connection of the first capacitor 320 and the second ground node 360.

In an embodiment, the connection between the at least one capacitor and the second node, which is based on operation 440, may be maintained when all of the condition where the camera module is operated based on operation 420, and the condition where the wireless signal related to the communication module is identified based on operation 430 are satisfied. For example, when the operation of the camera module is stopped or the wireless signal related to the communication module is not identified after the at least one capacitor and the second node are connected, the electronic device may connect the at least one capacitor and the first node and may restrict connection between the at least one capacitor and the second node.

Referring to FIG. 4, the at least one capacitor related to the power supply node of the camera module being connected or switched to any one of the first node and the second node may be related to an operation state of the camera module and a transmission and reception state of a wireless signal. For example, the electronic device may connect the at least one capacitor to any one of the first node and the second node, by distinguishing between the case where the camera module is operated and the case where the camera module is operated, and simultaneously, the wireless signal is transmitted and received. The at least one capacitor being selectively connected with the first node or the second node may be performed to enhance a noise and/or a receiver sensitivity of a wireless signal.

In an embodiment, the at least one capacitor being selectively connected with the first node or the second node may be performed to enhance a receiver sensitivity of a wireless, without degrading quality of an image acquired from the camera module. In an embodiment, the at least one capacitor being selectively connected with the first node or the second node may be performed to enhance a receiver sensitivity of a wireless signal even if quality of an image acquired from the camera module is degraded. In an embodiment, the at least one capacitor being selectively connected with the first node or the second node may be performed to enhance quality of an image acquired from the camera module even if a receiver sensitivity of a wireless signal is degraded.

In an embodiment, when wireless signals based on LTE B5 and LTE 12, respectively, are identified with the camera module being operated, the electronic device can enhance sensitivity of the wireless signals as much as 1.7 dB and 2.2 dB in LTE B5 and LTE 12, respectively, by switching the at least one capacitor corresponding the power supply node of the camera module from the first node to the second node. In an embodiment, when wireless signals based on IEEE 802.11b and IEEE 802.11g, respectively, are identified with the camera module being operated, the electronic device can enhance sensitivity of the wireless signals as much as 1.7 dB and 3.0 dB in IEEE 802.11b and IEEE 802.11g, respectively, by switching the at least one capacitor corresponding to the power supply node of the camera module from the first node to the second node.

Figure 5:
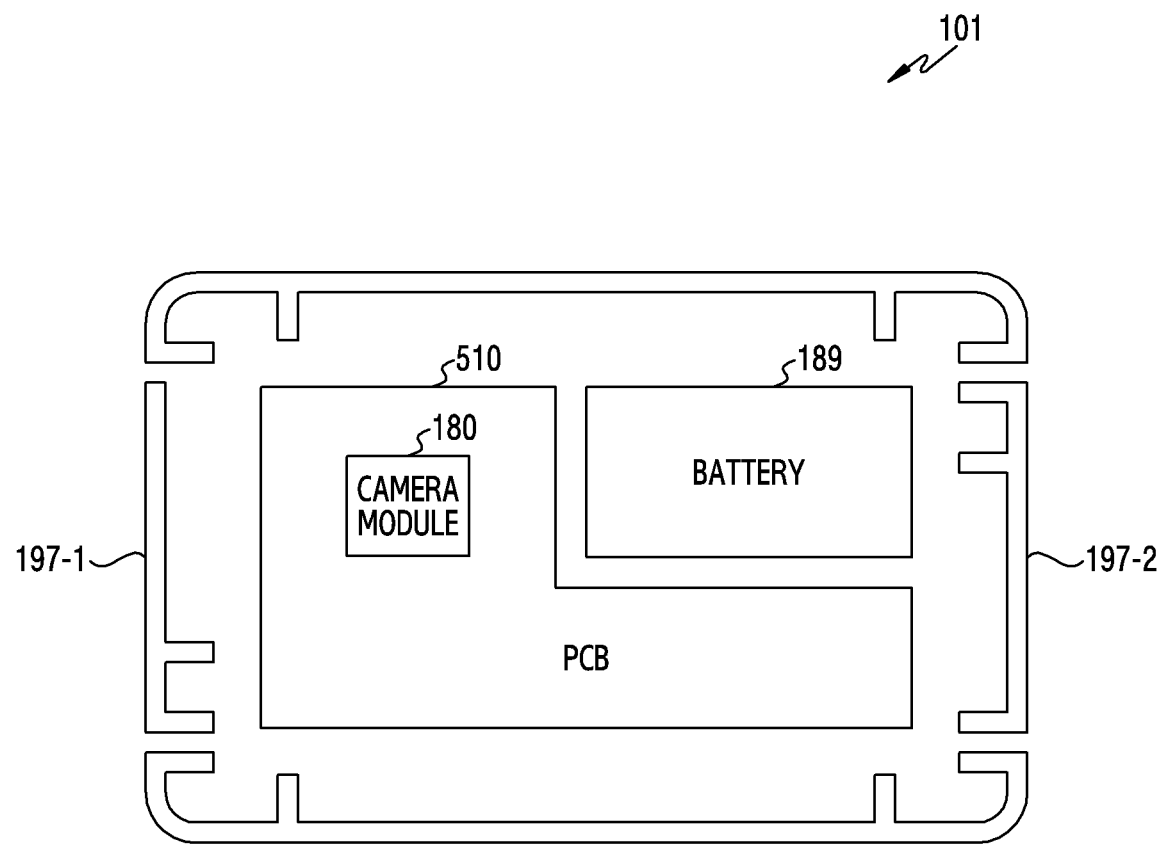
FIG. 5 is a view to explain arrangements of a camera module and antenna modules in a housing of an electronic device according to various embodiments.

FIG. 5 is a view to explain an example of arrangements of a camera module 180 and antenna modules 197-1, 197-2 in a housing of an electronic device 101 according to various embodiments. The electronic device 101 of FIG. 5 may correspond to the electronic device 101 of FIGS. 1 to 3. The electronic device 101 of FIG. 5 may perform at least one of the operations of FIG. 4.

Referring to FIG. 5, the electronic device 101 may include a PCB 510. A plurality of hardware components may be disposed on the PCB 510. The PCB 510 of the electronic device 101 may be disposed adjacent to a battery 189 included in the electronic device 101. A camera module 180 may be disposed on the PCB 510 of the electronic device 101 or may be connected with another hardware component (for example, a processor) of the electronic device 101 through a part of the PCB 510 (for example, a socket including a plurality of ports). At least a part of the camera module 180 may be exposed to outside through a front surface or a rear surface of the housing of the electronic device 101. The front surface may indicate one surface of the housing on which a display of the electronic device 101 is disposed, and the rear surface may indicate one surface of the housing which is opposite to the front surface. When the electronic device 101 includes two or more camera modules 180, at least one of the two or more camera modules 180 may be disposed on the front surface, and the other one may be disposed on the rear surface.

Referring to FIG. 5, the electronic device 101 may include a plurality of antenna modules 197-1, 197-2. The plurality of antenna modules 197-1, 197-2 may be disposed on any one of side surfaces of the housing of the electronic device 101. Referring to FIG. 5, the plurality of antenna modules 197-1, 197-2 may be disposed on an upper side surface and a lower side surface of the side surfaces of the housing, respectively. Positions on which the plurality of antenna modules 197-1, 197-2 are disposed may vary according to an embodiment, and for example, the plurality of antenna modules 197-1, 197-2 may be disposed on a left side surface and a right side surface of the side surfaces of the housing, respectively.

At least one of the plurality of antenna modules 197-1, 197-2 may be disposed adjacent to the camera module 180. Referring to FIG. 5, the antenna module 197-1 may be disposed on a side surface that is closest to a part of the housing through which at least a part of the camera module 180 is seen, from among the side surfaces of the housing of the electronic device 101. The antenna module 197-2 may be disposed on a side surface that is relatively farther away from the camera module 180 than the antenna module 197-1, from among the side surfaces of the housing of the electronic device 101. For example, when the electronic device 101 transmits or receives a wireless signal through the antenna module 197-1 with the camera module 180 being operated, radiation performance of the antenna module 197-1 may be degraded due to the operating camera module 180.

According to an embodiment, the electronic device 101 may identify a state of the camera module 180 in response to identification of a wireless signal related to the antenna module 197-1. In response to identification of a state of the camera module 180 capturing at least one image, the electronic device 101 may connect a ground node related to the camera module 180 to any one of a digital ground node and an analogue ground node. Hereinafter, structures of the camera module 180 on the PCB 510, the digital ground node and the analogue ground node will be described in detail with reference to FIG. 6.

Figure 6:
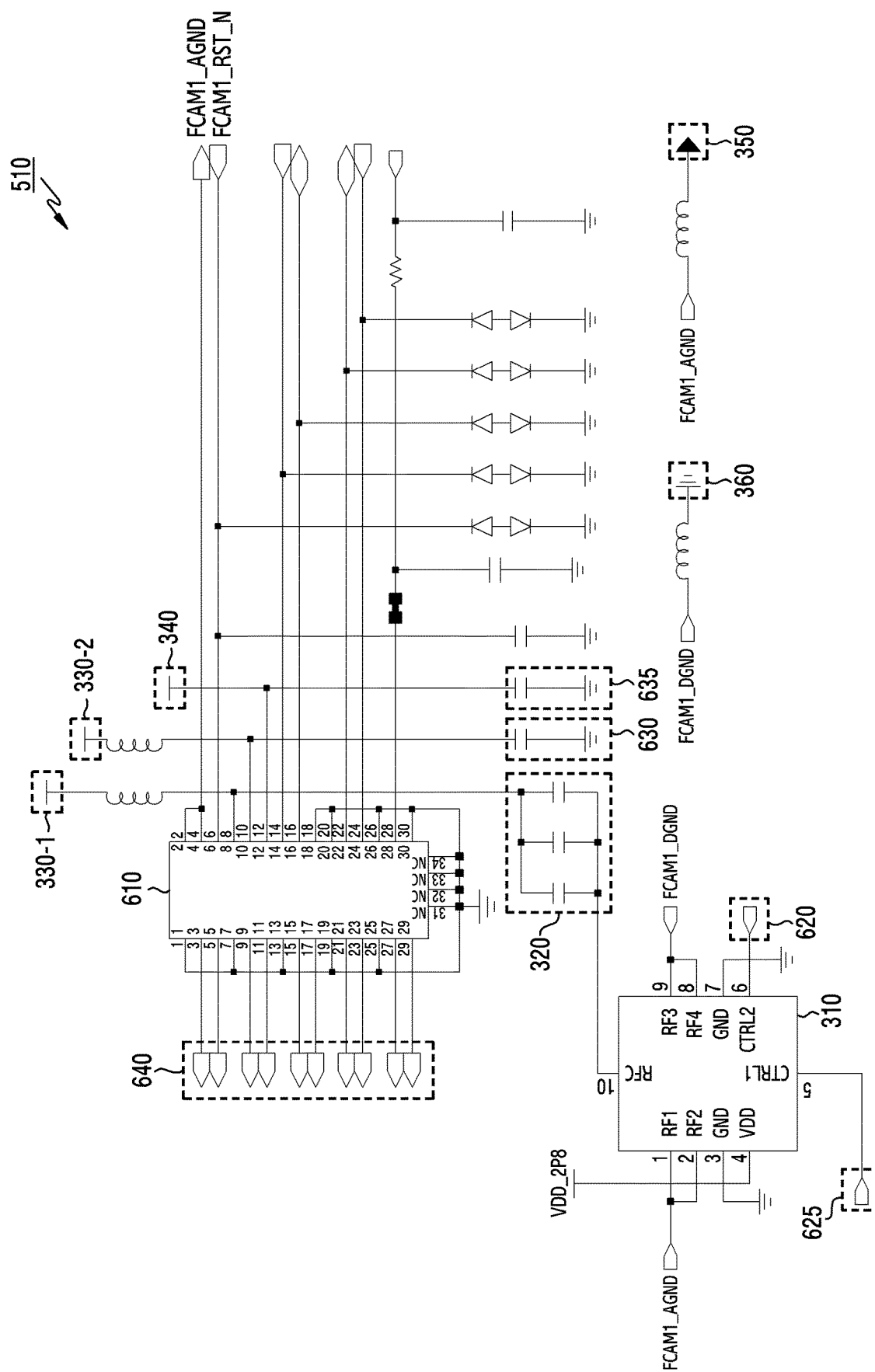
FIG. 6 is a view to explain a structure of a part of a PCB of an electronic device according to various embodiments.

FIG. 6 is a view to explain a structure of a part of a PCB 510 of an electronic device according to various embodiments. The electronic device of FIG. 6 may correspond to the electronic device 101 of FIGS. 1 to 3 and FIG. 5. The electronic device of FIG. 6 may perform at least one of the operations of FIG. 4.

Referring to FIG. 6, a socket 610 connecting the PCB 510 and a camera module may be disposed on the PCB 510. The socket 610 may include a plurality of ports having different usages. For example, the socket 610 may include at least one port (ports 8, 10, 12 in FIG. 6) for supplying a power to the camera module. For example, the socket 610 may include at least one port (ports 3, 5, 9, 11, 15, 17, 21, 23, 27, 29 in FIG. 6) for transmitting and receiving data related to the camera module. The plurality of ports included in the socket 610 to transmit and receive data may correspond to a data interface 640 between the camera module 610 and a processor.

For example, the socket 610 may include at least one port (ports 1, 7, 13, 19, 25, 18, 20, 26, and 30-34 in FIG. 6) for grounding circuit elements for processing a digital signal of the camera module. The at least one ports may be connected to a second ground node 360 corresponding to a digital ground node.

For example, the socket 610 may include at least one port (ports 2 and 4 in FIG. 6) for grounding circuit elements for processing an analogue signal of the camera module. The at least one port may be connected to a first ground node 350 corresponding to an analogue ground node. The first ground node 350 and the second ground node 360 may correspond to the first ground node 350 and the second ground node 360 of FIG. 3, respectively.

For example, the socket 610 may include at least one port (ports 8, 10, and 12 in FIG. 6) for inputting a power to the camera module. When the plurality of ports are used to input a power, the plurality of ports may receive direct current electric signals having voltages of different levels. The plurality of ports may transmit the received direct current electric signals to different circuit elements in the camera module. Referring to FIG. 6, port 8 and port 10 may be connected to first power supply nodes 330-1, 330-2 which are based on an analogue power supply, and may supply a power to a circuit element (for example, the image sensor 130 of FIG. 2) using an analogue power supply in the camera module. Referring to FIG. 6, ports 8 and 10 may be connected to the first power supply nodes 330-1, 330-2 through at least one inductor. Referring to FIG. 6, port 12 may be connected to a second power supply node 340 which is based on a digital power supply, and may supply a power to a circuit element (for example, the image signal processor 140 of FIG. 2) using a digital power supply in the camera module.

The first power supply nodes 330-1, 330-2 and the second power supply node 340 may be related to the first power supply node 330 and the second power supply node 340 of FIG. 3. The first power supply nodes 330-1, 330-2 and the second power supply node 340 may output direct current electric signals having designated voltages of different levels. The direct current electric signal may include a frequency component having an amplitude within a designated range, as a noise and/or an alternating current component.

Referring to FIG. 6, a plurality of capacitors 320, 630, 635 which are connected with the first power supply nodes 330-1, 330-2 and the second power supply node 340 and ports of the socket 610 in parallel may be disposed on the PCB 510. Referring to FIG. 6, the first capacitor 320 of the plurality capacitors may be connected with the first power supply node 330-1 and port 8 of the socket 610 in parallel. In an embodiment, the first capacitor of the plurality of capacitors may be connected with at least one inductor connected with the first power supply node 330-1 and port 8 of the socket 610 in parallel. A second capacitor 630 of the plurality of capacitors may be connected with the first power supply node 330-2 and port 10 in parallel. A third capacitor 635 of the plurality of capacitors may be connected with the second power supply node 340 and port 12. The plurality of capacitors 320, 630, 635 may be connected to the first ground node 350 and/or the second ground node 360 in order to reduce an amplitude of a frequency component included in a direct current electric signal outputted from the first power supply nodes 330-1, 330-2 and the second power supply node 340.

Referring to FIG. 6, a switching circuit 310 may be connected with the first capacitor 320 of the plurality of capacitors, and may connect the first capacitor 320 of the plurality to capacitors to the first ground node 350 or the second ground node 360. The switching circuit 310 may include a port (port 10 in the example of FIG. 6) connected with the first capacitor 320 of the plurality of capacitors. The switching circuit 310 may include a port (port 4 in the example of FIG. 6) to receive a power, and a port (port 3 and port 7 in the example of FIG. 6) to ground a circuit element included in the switching circuit 310. The switching circuit 310 may include ports (port 5 625 and port 6 620) to receive a control signal. The ports of the switching circuit 310 for receiving the control signal may be connected to a controller (for example, the controller 300 of FIG. 3) corresponding to the switching circuit 310.

The switching circuit 310 may include at least one port (port 1 and port 2 in the example of FIG. 6) connected with the first ground node 350 corresponding to an analogue ground node, and at least one port (port 8 and port 9 in the example of FIG. 6) connected with the second ground node 360 corresponding to a digital ground node. Referring to FIG. 6, at least one inductor may be disposed between the plurality of ports of the switching circuit 310, and the first ground node 350 and the second ground node 360. The switching circuit 310 may connect the first capacitor 320 of the plurality of capacitors that is connected to port 10 to the first ground node 350 or the second ground node 360, based on a control input inputted to port 5 625 and/or port 6 620. The control signal may be transmitted from the controller connected to the switching circuit 310, through port 5 625 and port 6 620. The controller may output the control based on at least one of the operations of FIG. 4.

In an embodiment, in a state where the camera module is operated and an antenna module is not operated, the first capacitor 320 connected to the first power supply node 330-1, which is based on an analogue power supply, may be connected to the first ground node 350 corresponding to the analogue ground node, through ports 1 and 2 of the switching circuit 310. In an embodiment, in a state where all of the camera module and the antenna module are operated, the first capacitor 320 may be connected to the second ground node 360 corresponding to the digital ground node through ports 8 and 9 of the switching circuit 310. The camera module being operated may include a state in which the camera module captures an image and/or a video. The antenna module being operated may include a state in which the antenna module transmits or receive a wireless signal.

Although the embodiment in which the first capacitor 320 related to a part 330-1 of the first power supply nodes are connected to any one of the first ground node 350 or the second ground node 360 through the switching circuit 310 is illustrated in FIG. 6, various embodiments are not limited to the embodiment of FIG. 6. According to an embodiment, all of the plurality of capacitors 320, 630 related to the first power supply nodes 330-1, 330-2 may be connected to any one of the first ground node 350 or the second ground node 360 through the switching circuit 310. According to an embodiment, only the first capacitor 320 related to a part 330-1 of the first power supply nodes may be connected to any one of the first ground node 350 or the second ground node 360 through the switching circuit 310.

According to an embodiment, the control signal transmitted to port 5 625 and port 6 620 may be related not only to an operation state of the camera module, the communication module, and/or the antenna module, but also to radiation performance of the antenna module, a noise included in a wireless signal related to the antenna module, and/or a receiver sensitivity of the wireless signal. Hereinafter, an operation of generating a control signal based on radiation performance of an antenna module and a noise included in a wireless signal related to the antenna module in an electronic device will be described with reference to FIG. 7.

Figure 7:
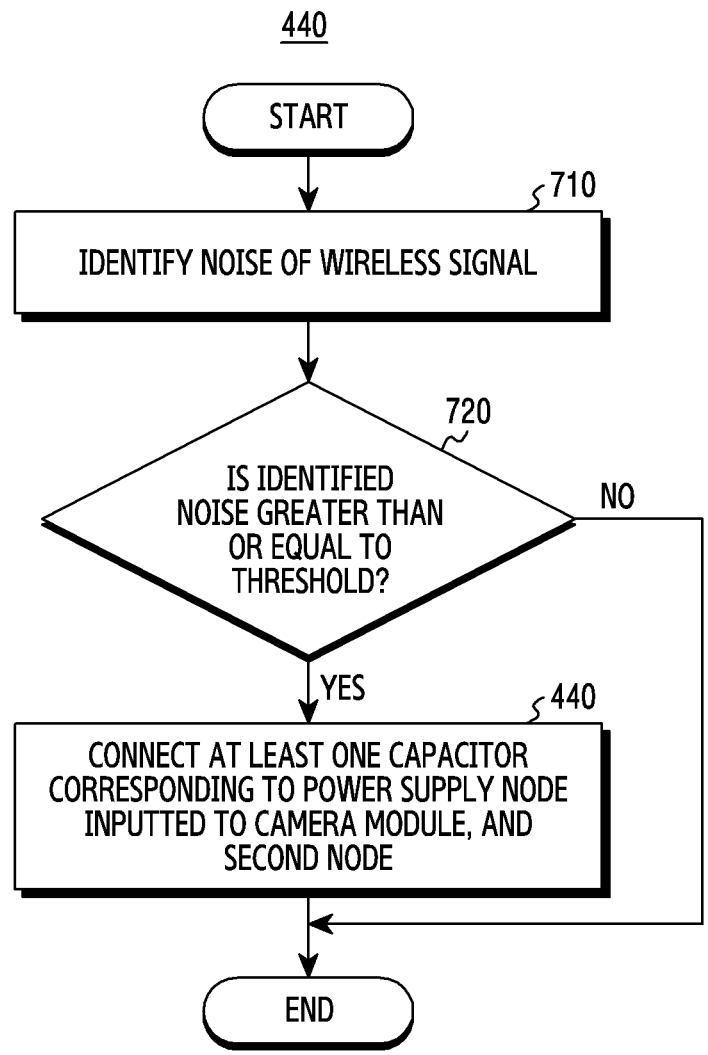
FIG. 7 is a flowchart to explain an operation performed by an electronic device based on a wireless signal identified through an antenna according to various embodiments.

FIG. 7 is a flowchart 440 for explaining an operation performed by an electronic device based on a wireless signal identified through an antenna according to various embodiments. The electronic device of FIG. 7 may correspond to the electronic device 101 of FIGS. 1 to 3. Operations of FIG. 7 may be related to operation 440 of FIG. 4.

Referring to FIG. 7, in operation 710, the electronic device according to various embodiments may identify a noise of a wireless signal. Operation 710 may be performed in a state where the electronic device identifies a wireless signal related to a communication module based on operation 430 of FIG. 4. For example, in response to identification of a state of the communication module and/or the antenna transmitting or receiving a wireless signal, the electronic device may identify a receiver sensitivity and/or a noise of a wireless signal related to the antenna. For example, operation 710 may be performed in a state where at least one capacitor (for example, the first capacitor 320 of FIG. 6) corresponding to a power source node inputted to the camera module is connected to a first node (for example, the first ground node 350 of FIG. 6) based on operation 410 of FIG. 4.

The wireless signal may correspond to a wireless signal which is received through the antenna module of the electronic device. The electronic device may acquire at least one parameter related to the noise of the wireless signal. The at least one parameter may include at least one of a receiving sensitivity of the wireless signal, a strength of the wireless signal, or a bit error rate (BER) of data included in the wireless signal. The receiving sensitivity of the wireless signal may be acquired by the electronic device, based on a received signal strength indicator (RSSI), a reference signal received power (RSRP), and/or a received signal code power (RSCP). The operation of identifying the noise may include an operation of acquiring the at least one parameter.

Referring to FIG. 7, in operation 720, the electronic device according to various embodiments may determine whether the identified noise is greater than or equal to a designated threshold. The designated threshold may correspond to at least one parameter related to the noise. For example, the designated threshold may include a threshold regarding a receiving sensitivity and/or a threshold regarding a BER. Referring to FIG. 7, when the identified noise is less than the designated threshold, for example, when the receiving sensitivity of the wireless signal exceeds a designated threshold or the BER of the wireless signal is less than a designated threshold, the electronic device may maintain a connection state between the at least one capacitor and the first node, based on operation 410 of FIG. 4.

When the identified noise is greater than or equal to the threshold, the electronic device according to various embodiments may connect at least one capacitor corresponding to a power supply node inputted to a camera module, and a second node in operation 440. The electronic device may perform operation 440 of FIG. 7 similarly to operation 440 of FIG. 4. For example, when the receiving sensitivity of the wireless signal is less than the designated threshold or the BER of the wireless signal exceeds the designated threshold, the electronic device may connect at least one capacitor (for example, the first capacitor 320 of FIG. 6) and the second node (for example, the second ground node 360 of FIG. 6), similarly to operation 440 of FIG. 4. In an embodiment, the electronic device may switch the at least one capacitor from the first node to the second node.

The at least one capacitor and the second node are connected with each other, so that the receiving sensitivity of the wireless signal and/or the radiation performance of the antenna module can be enhanced. The receiving sensitivity of the wireless signal and/or the radiation performance of the antenna module is enhanced, so that the noise of the wireless signal can be reduced to be less than the designated threshold. For example, the receiving sensitivity may increase to be greater than or equal to designated threshold, or the BER of the wireless signal may be reduced to be less than the designated threshold.

In an embodiment, the connection between the at least one capacitor and the second node may be maintained when all of the condition where the camera module is operated based on operation 420 of FIG. 4, and the condition regarding the noise included in the wireless signal based on operation 720 are satisfied. For example, when the operation of the camera module is stopped or the noise included in the wireless signal is reduced to be less than the designated threshold after the at least one capacitor and the second node are connected, the electronic device may connect the at least one capacitor and the first node, and may restrict the connection between the at least one capacitor and the second node.

Figure 8:
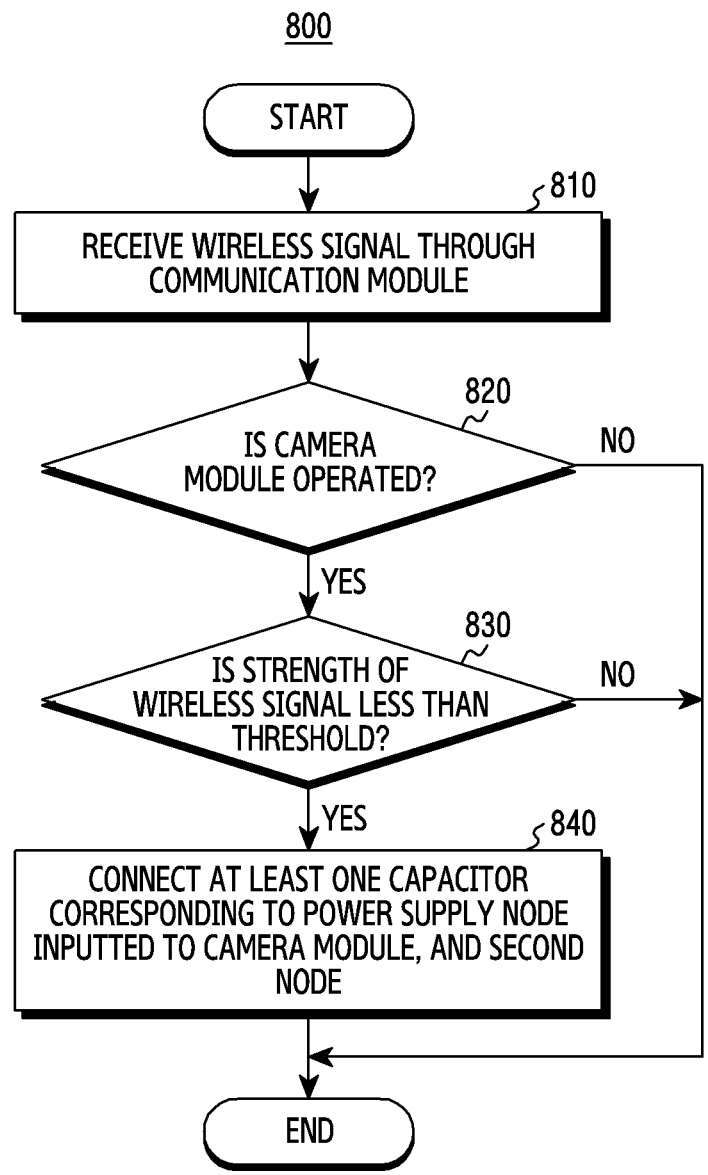
FIG. 8 is a flowchart to explain an operation performed by an electronic device based on a strength of a wireless signal received through an antenna according to various embodiments.

FIG. 8 is a flowchart 800 to explain an operation performed by an electronic device based on a strength of a wireless signal received through an antenna according to various embodiments. The electronic device of FIG. 8 may correspond to the electronic device 101 of FIGS. 1 to 3. Operations of FIG. 8 may be related to at least a part of the operations of FIG. 4 and/or FIG. 7.

Referring to FIG. 8, in operation 810, the electronic device according to various embodiments may receive a wireless signal through a communication module. In operation 810, the electronic device may receive the wireless signal based on an antenna module adjacent to a camera module. In the state where the wireless signal is received, a power supply node (for example, the first power supply node 330 of FIG. 3) which is based on analogue power supply of the camera module may be connected to an analogue ground node (for example, the first ground node 350 of FIG. 3) through at least one capacitor (for example, the first capacitor 320 of FIG. 3) for reducing a noise included in the analogue power supply. The connection between the at least one capacitor and the analogue ground node may be performed by, for example, the switching circuit 310 of FIG. 3.

In the state where the wireless signal is received, in operation 820, the electronic device according to various embodiments may determine whether the camera module is operated. It is determined whether the camera module is operated, according to a type of an application ongoing in a processor of the electronic device and/or whether a user input for operating the camera module is received. The electronic device may perform operation 820 similarly to operation 420 of FIG. 4.

When the camera module is operated, the electronic device according to various embodiments may determine whether a strength of the wireless signal received through the communication module is less than a designated threshold in operation 830. When the camera module is operated, an interference signal may be generated and a receiving sensitivity of the wireless signal of the electronic device may attenuate. The strength of the wireless signal may be a strength of the wireless signal based on the unit of dBm. When the strength of the wireless signal is greater than or equal to the threshold, the electronic device may maintain the connection between the at least one capacitor and the analogue ground node. When the strength of the wireless signal is greater than or equal to the threshold, a signal to noise ratio (SNR) or a signal to interference plus noise ratio (SINR) required to perform communication may be satisfied even if an interference signal is generated in the camera module, and accordingly, the electronic device can maintain normal communication.

When the strength of the wireless signal is less than the threshold, in operation 840, the electronic device according to various embodiments may connect at least one capacitor corresponding to a power supply node inputted to the camera module, and a second node. The electronic device may perform operation 840 similarly to operation 440 of FIG. 4. In an embodiment, the electronic device may connect a power supply node (for example, the first power supply node 330 of FIG. 3) which is based on an analogue power supply of the camera module to a digital ground node (for example, the second ground node 360 of FIG. 3) through at least one capacitor (for example, the first capacitor 320 of FIG. 3) for reducing a noise included in the analogue power supply. The connection between the at least one capacitor and the digital ground node may be performed by, for example, the switching circuit 310 of FIG. 3. The power supply node of the camera module is connected to the digital ground node through the at least one capacitor, so that a strength of a wireless signal received through the communication module can increase. For example, the strength of the wireless signal can increase to be greater than or equal to the threshold.

The electronic device according to various embodiments may switch at least one capacitor for reducing a noise included in a direct current electric signal inputted to the camera module to any one of an analogue ground node and a digital ground node. The switching may be performed based on at least a part of an operation state of the camera module and an operation state of the antenna module. For example, when a wireless signal related to the antenna module is not identified with the camera module being operated, the electronic device may connect the at least one capacitor to the analogue ground node. For example, in response to identification of a wireless signal related to the antenna module with the camera module being operated, the electronic device may connect the at least one capacitor to the digital ground node. In the state where the at least one capacitor is connected to the digital ground node, the electronic device may restrict connection between the analogue ground node and the at least one capacitor. The at least one capacitor is connected to the digital ground node, so that radiation performance of the antenna module can be enhanced and a noise included in the wireless signal can be reduced.

According to various embodiments, an electronic device may include an antenna, a camera module, at least one capacitor, a switching circuit, and a controller which is operatively coupled to the antenna, the camera module, the at least one capacitor, and the switching circuit, and the controller may identify a wireless signal related to the antenna in a state where the at least one capacitor connected with a power supply node inputted to the camera module in parallel is connected to a first node by the switching circuit, and, in response to the identification of the wireless signal, may control the switching circuit to connect the at least one capacitor to a second node distinguished from the first node from the first node.

According to an embodiment, in a state where the camera module captures an image or a video, the controller may connect the at least one capacitor to the second node in response to the identification of the wireless signal.

According to an embodiment, the power supply node may output an analogue power supply inputted to an image sensor of the camera module, and the at least one capacitor may be disposed between the power supply node and the switching circuit in order to reduce a noise included in the analogue power supply.

According to an embodiment, the first node may be a ground node which is connected with at least one circuit element for processing an analogue signal within the camera module.

According to an embodiment, the second node may be a ground node which is connected with at least one circuit element for processing a digital signal within the camera module.

According to an embodiment, the antenna may be disposed on a side surface that is closest to a part of a front surface or a rear surface of a housing through which at least a part of the camera module is seen.

According to an embodiment, the wireless signal related to the antenna may include at least one of a GPS signal, a data signal, or an voice signal received through the antenna.

According to an embodiment, the controller may include at least one processor for executing at least one instruction stored in a communication circuit connected with the antenna or a memory of the electronic device.

According to an embodiment, the controller may identify a noise included in the wireless signal in response to the identification of the wireless signal, and, in response to an identification of the noise exceeding a designated threshold, may control the switching circuit to switch the at least one capacitor from the first node to the second node.

According to an embodiment, the controller may identify the noise, based on a strength of the wireless signal or a bit error rate (BER) of data included in the wireless signal.

According to various embodiments, there is provided an electronic device including at least one port for supplying a power to a camera module of the electronic device, at least one capacitor connected with the at least one port, and a switching circuit connected with the at least one capacitor, wherein the switching circuit switches the at least one capacitor between a first node and a second node, based on a control signal inputted to the switching circuit, and the first node and the second node are nodes which ground a first circuit element included in the camera module to process an analogue signal, and a second circuit element included in the camera module to process a digital signal, respectively.

According to an embodiment, the electronic device may further include a communication circuit for processing a wireless signal related to the electronic device, and the communication circuit may transmit the control signal for connecting the at least one capacitor and the second node to the switching circuit in response to detection of the wireless signal.

According to an embodiment, the switching circuit may restrict connection between the at least one capacitor and the first node while connecting the at least one capacitor and the second node based on the control signal.

According to an embodiment, in response to the detection of the wireless signal, the communication circuit may identify a noise included in the wireless signal, and, in response to the identification of the noise, may transmit the control signal to the switching circuit.

According to an embodiment, in response to the identification of the wireless signal, the communication circuit may identify a state of the camera module, and in response to an identification of the state of the camera module capturing at least one image, may transmit the control signal for connecting the at least one capacitor and the second node to the switching circuit.

According to an embodiment, the at least one capacitor may be connected with the at least one port and a power supply node for supplying the power in parallel.

According to various embodiments, there is provided a method of an electronic device, the method including: identifying a state of a camera module of the electronic device; in response to an identification of the state of the camera module capturing at least one image, identifying a state of an antenna of the electronic device; and, in response to an identification of the state of the antenna which transmits or receive a wireless signal, connecting at least one capacitor connected to a power supply node related to the camera module to a ground node for grounding a circuit element which is included in the camera module to process a digital signal.

According to an embodiment, the method may further include, in response to an identification of the state of the antenna corresponding to an idle state, connecting the at least one capacitor to a second ground node for grounding a circuit element which is included in the camera module to process an analogue signal.

According to an embodiment, the method may further include, in response to an identification of the state of the antenna which transmits or receives the wireless signal, identifying a noise of the wireless signal related to the antenna.

According to an embodiment, connecting the at least one capacitor to the ground node may include connecting the at least one capacitor the ground node, based on the identified noise and a designated threshold related to the noise.

According to an embodiment, the power supply node may correspond to a node which supplies a power to a circuit element which is included in the camera module to process an analogue signal.

Methods based on the claims or the embodiments disclosed in the disclosure may be implemented in hardware, software, or a combination of both.

When implemented in software, a computer readable storage medium for storing one or more programs (software modules) may be provided. The one or more programs stored in the computer readable storage medium are configured for execution performed by one or more processors in an electronic device. The one or more programs include instructions for allowing the electronic device to execute the methods based on the claims or the embodiments disclosed in the disclosure.

The program (the software module or software) may be stored in a random access memory, a non-volatile memory including a flash memory, a read only memory (ROM), an electrically erasable programmable read only memory (EEPROM), a magnetic disc storage device, a compact disc-ROM (CD-ROM), digital versatile discs (DVDs) or other forms of optical storage devices, and a magnetic cassette. Alternatively, the program may be stored in a memory configured in combination of all or some of these storage media. In addition, the configured memory may be plural in number.

Further, the program may be stored in an attachable storage device capable of accessing the electronic device through a communication network such as the Internet, an Intranet, a local area network (LAN), a wide LAN (WLAN), or a storage area network (SAN) or a communication network configured by combining the networks. The storage device may access via an external port to a device which performs the embodiments of the disclosure. In addition, an additional storage device on a communication network may access to a device which performs the embodiments of the disclosure.

In the above-described specific embodiments of the disclosure, elements included in the disclosure are expressed in singular or plural forms according to specific embodiments. However, singular or plural forms are appropriately selected according to suggested situations for convenience of explanation, and the disclosure is not limited to a single element or plural elements. An element which is expressed in a plural form may be configured in a singular form or an element which is expressed in a singular form may be configured in plural number.

While specific embodiments have been described in the detailed descriptions of the disclosure, it will be understood by those skilled in the art that various changes in form and details may be made therein without departing from the spirit and scope of the disclosure as defined by the appended claims. Therefore, the scope of various embodiments of the disclosure is defined not by the described embodiments but by the appended claims or the equivalents to the claims.

The invention claimed is:

1. An electronic device comprising:
   an antenna;
   a camera module;
   at least one capacitor;
   a switching circuit; and
   a controller which is operatively coupled to the antenna, the camera module, the at least one capacitor, and the switching circuit, and
   wherein the controller is configured to:
   identify a wireless signal related to the antenna in a state where the at least one capacitor connected in parallel with a power supply node inputted to the camera module is connected to a first node by the switching circuit, and in response to the identification of the wireless signal, control the switching circuit to connect the at least one capacitor to a second node distinguished from the first node,
   wherein the first node is a first ground node which is connected with at least one circuit element for processing an analogue signal within the camera module, and
   wherein the second node is a second ground node which is connected with at least one circuit element for processing a digital signal within the camera module.

2. The electronic device of claim 1, wherein the controller is configured to, in a state where the camera module captures an image or a video, connect the at least one capacitor to the second node in response to the identification of the wireless signal.

3. The electronic device of claim 1, wherein the power supply node is configured to output an analogue power supply inputted to an image sensor of the camera module, and
   wherein the at least one capacitor is disposed between the power supply node and the switching circuit in order to reduce a noise included in the analogue power supply.

4. The electronic device of claim 1, wherein the antenna is disposed on a side surface that is closest to a part of a front surface or a rear surface of a housing through which at least a part of the camera module is seen.

5. The electronic device of claim 1, wherein the wireless signal related to the antenna comprises at least one of a GPS signal, a data signal, or a voice signal received through the antenna.

6. The electronic device of claim 1, wherein the controller comprises at least one processor for executing at least one instruction stored in a communication circuit connected with the antenna or a memory of the electronic device.

7. The electronic device of claim 1, wherein the controller is configured to identify a noise included in the wireless signal in response to the identification of the wireless signal, and, in response to an identification of the noise exceeding a designated threshold, to control the switching circuit to switch the at least one capacitor from the first node to the second node.

8. The electronic device of claim 7, wherein the controller is configured to identify the noise, based on a strength of the wireless signal or a bit error rate (BER) of data included in the wireless signal.

9. A method of an electronic device, the method comprising:
   identifying a state of a camera module of the electronic device;
   in response to an identification of the state of the camera module capturing at least one image, identifying a state of an antenna of the electronic device; and
   in response to an identification of the state of the antenna which transmits or receive a wireless signal, connecting at least one capacitor connected to a power supply node related to the camera module to a ground node for grounding a circuit element which is included in the camera module to process a digital signal.

10. The method of claim 9, further comprising, in response to an identification of the state of the antenna corresponding to an idle state, connecting the at least one capacitor to a second ground node for grounding a circuit element which is included in the camera module to process an analogue signal.

11. The method of claim 9, further comprising, in response to an identification of the state of the antenna which transmits or receives the wireless signal, identifying a noise of the wireless signal related to the antenna.

12. The method of claim 11, wherein connecting the at least one capacitor to the ground node comprises connecting the at least one capacitor the ground node, based on the identified noise and a designated threshold related to the noise.

13. The method of claim 9, wherein the power supply node corresponds to a node which supplies a power to a circuit element which is included in the camera module to process an analogue signal.

14. The method of claim 9, wherein identifying the state of the antenna further comprises identifying at least one wireless signal from a GPS signal, a data signal, or a voice signal received through the antenna.

* * * * *